(12) United States Patent
Adams et al.

(10) Patent No.: US 7,788,554 B2
(45) Date of Patent: *Aug. 31, 2010

(54) DESIGN STRUCTURE EMBODIED IN A MACHINE READABLE MEDIUM FOR IMPLEMENTING SRAM CELL WRITE PERFORMANCE EVALUATION

(75) Inventors: Chad Allen Adams, Byron, MN (US); Derick Gardner Behrends, Rochester, MN (US); Travis Reynold Hebig, Rochester, MN (US); Daniel Mark Nelson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 401 days.

This patent is subject to a terminal disclaimer.

(21) Appl. No.: 11/873,173

(22) Filed: Oct. 16, 2007

(65) Prior Publication Data

US 2009/0063912 A1 Mar. 5, 2009

Related U.S. Application Data

(63) Continuation-in-part of application No. 11/845,866, filed on Aug. 28, 2007, now Pat. No. 7,503,340.

(51) Int. Cl.
*G11C 29/00* (2006.01)
*G11C 7/00* (2006.01)

(52) U.S. Cl. .................. 714/718; 365/201; 365/189.08; 365/189.09

(58) Field of Classification Search .................. 714/718; 365/201, 189.08, 189.09
See application file for complete search history.

(56) References Cited

U.S. PATENT DOCUMENTS

| | | | |
|---|---|---|---|
| 6,414,535 B1 * | 7/2002 | Ooishi ......................... | 327/538 |
| 6,728,912 B2 | 4/2004 | Dawson et al. | |
| 7,133,320 B2 * | 11/2006 | Adams et al. ............... | 365/201 |
| 7,278,034 B2 * | 10/2007 | Shipton ...................... | 713/300 |
| 7,505,340 B1 | 3/2009 | Adams et al. | |
| 2008/0162770 A1 * | 7/2008 | Titiano et al. ............... | 710/309 |
| 2009/0063912 A1 | 3/2009 | Adams et al. | |

* cited by examiner

*Primary Examiner*—John J Tabone, Jr.
(74) *Attorney, Agent, or Firm*—Joan Pennington

(57) ABSTRACT

A design structure embodied in a machine readable medium for implementing static random access memory (SRAM) cell write performance evaluation is provided. A SRAM core includes each wordline connected to only one bit column. A ring oscillator circuit is used to generate wordline pulses. A state machine controls operations for the SRAM cell write performance evaluation circuit including the ring oscillator circuit and the SRAM core. A control signal is applied to the state machine to select a first write operation, where the circuit simultaneously writes all the cells to a known state with wide wordlines to ensure all cells are written. Then a second write operation is selected, and all the wordlines are launched simultaneously to write the cells to the opposite state. From these write operations, a required wordline pulse width to write the cell is identified.

16 Claims, 7 Drawing Sheets

| ENABLE | 0 0 0 0 0 0 0 0 | 1 1 1 1 1 1 1 1 1 1 1 1 1 1 1 1 1 1 1 1 * * * | 0 0 |

ENABLE    0 0 0 0 0 0 0 0  1 1 1 1 1 1 1 1 1 1 1 1 1 1 1 1 1 1 1 1 * * *    0 0

RINGSIG   0 1 0 1 0 1 0 1 0 1 0 1 0 1 0 1 0 1 0 1 0 1 0 1 0 1 0 1 0    0 1 0

ACT_WL    1 1 1 1 1 1 1 1 1 1 1 0 0 0 0 1 1 0 0 0 0 1 1 0 0 0 0    0 1 1

DATA      0 0 0 0 0 0 0 0 0 0 0 0 0 1 1 1 1 1 1 0 0 0 0 0 0 0 0    0 0 0

R/$\overline{W}$    0 0 0 0 0 0 0 0 0 0 0 0 0 0 0 0 0 0 0 0 1 1 1 1 1 1 0 0    0 0 0

NARROW/
WIDE_B    0 0 0 0 0 0 0 0 0 0 0 0 0 1 1 1 1 1 1 0 0 0 0 0 0 0 0    0 0 0

DESIGN STRUCTURE EMBODIED IN A MACHINE READABLE MEDIUM FOR IMPLEMENTING SRAM CELL WRITE PERFORMANCE EVALUATION

This application is a continuation-in-part application of Ser. No. 11/845,866 filed on Aug. 28, 2007, now U.S. Pat. No. 7,503,340.

FIELD OF THE INVENTION

The present invention relates generally to the data processing field, and more particularly, relates to a method and apparatus for implementing static random access memory (SRAM) cell write performance evaluation, and a design structure on which the subject circuit resides.

DESCRIPTION OF THE RELATED ART

In advanced CMOS technology, devices used in SRAM cells are different than devices used elsewhere on a chip. These differences include dopant levels, layout topologies, and channel lengths.

A need exists for an effective method and circuit to evaluate SRAM cell write performance in hardware. It is desirable to provide such method and circuit that enables characterizing the wordline pulse width to identify a minimum wordline pulse width to write the cell. Known prior art test arrangements do not enable incrementally varying the wordline pulse width.

For example, U.S. Pat. No. 6,728,912 to Dawson et al. issued Apr. 27, 2004, entitled SOI Cell Stability Test Method and assigned to the present assignee, discloses a method for testing SOI technology memory circuits, such as in SRAMs, for weak SOI cells, that uses a reset test circuit with a wordline pulse width control circuit. The method can be implemented without performance impact and allows using unused silicon to minimize area usage impact and permits screening of integrated SOI memory array circuits for weak SOI cells using the test reset circuit to selectively change the wordline pulse width to a reduced time while the memory cell bit select and write signals turn off at normal times to stress the cell write margin. During test, the word line pulse width can be extended by blocking the reset signal of the reset path test circuit to the word path to produce a longer than normal pulse width. During a test for normal operations the reset signal is allowed to pass through a pass gate multiplexer of the reset test circuit.

SUMMARY OF THE INVENTION

Principal aspects of the present invention are to provide a method and apparatus for implementing static random access memory (SRAM) cell write performance evaluation, and a design structure on which the subject circuit resides. Other important aspects of the present invention are to provide such a method and apparatus for implementing static random access memory (SRAM) cell write performance evaluation substantially without negative effect and that overcome many of the disadvantages of prior art arrangements.

In brief, a method and apparatus for implementing static random access memory (SRAM) cell write performance evaluation, and a design structure on which the subject circuit resides are provided. A SRAM cell write performance evaluation circuit includes a SRAM core where each wordline is connected to only one bit column. A ring oscillator circuit coupled to the SRAM core generates wordline pulses. An input logic couples data to the SRAM core, and an output logic provides an oscillator signal at an output to identify a minimum wordline pulse width to write the cell. A state machine controls the ring oscillator circuit and write and read operations to the SRAM core for implementing SRAM cell write performance evaluation.

In accordance with features of the invention, an enable control signal is applied to the state machine to select a first write operation, where the circuit simultaneously writes all the cells to a known state with wide wordlines to ensure all cells are written. Then a second write operation is selected, and all the wordlines are launched simultaneously to write the cells to the opposite state. Each wordline is connected to one cell from different bitlines. In this second write operation, each wordline has a different narrow pulse width, as a result some of the cells are written and some are not written. The ring oscillator includes a series of wordline pulse generators creating signals with different pulse widths. The cells are read with the original wide wordline pulse width. Based on the results of the read, one of the frequency divider signals is selected for output. The selected frequency signal of the output shows the minimum wordline pulse width needed to write the cell.

When the enable control signal is high, the SRAM cell write performance evaluation circuit determines the wordline pulse width required to write the cell by reading the cells and setting a select bit in an output multiplexer based upon whether the cell connected was written properly. The select bits from the read operation determine how many times the frequency is divided. Then, the output oscillates at the natural frequency of the oscillator divided by an identified multiple of 2.

BRIEF DESCRIPTION OF THE DRAWINGS

The present invention together with the above and other objects and advantages may best be understood from the following detailed description of the preferred embodiments of the invention illustrated in the drawings, wherein:

FIG. 3 are timing diagrams illustrating the operation of the SRAM cell write performance evaluation circuit of FIGS. 1A and 1B in accordance with the preferred embodiment

DETAILED DESCRIPTION OF THE PREFERRED EMBODIMENTS

In accordance with features of the invention, a method and circuit are provided to evaluate SRAM cell write performance in hardware. The method and circuit provide for granularity in performance evaluation whereas prior art does not.

Figure 1A:
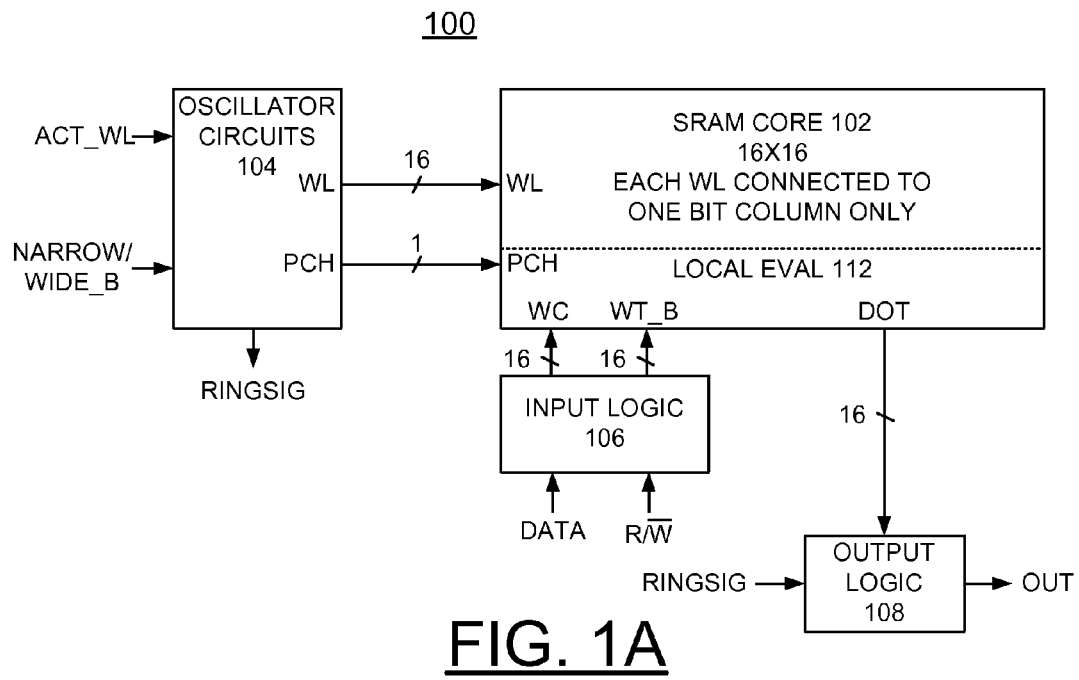
FIGS. 1A and 1B together provide a schematic diagram of an exemplary circuit for implementing static random access memory (SRAM) write performance evaluation in accordance with the preferred embodiment.
Figure 1B:
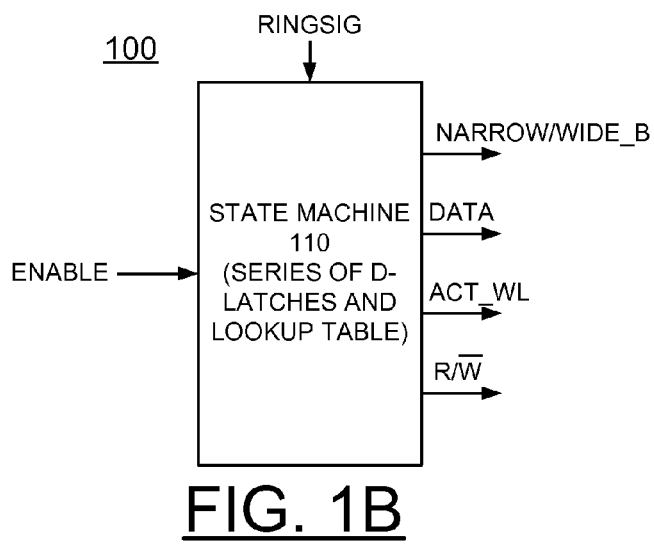

Having reference now to the drawings, in FIGS. 1A and 1B, there is shown an exemplary circuit for implementing static random access memory (SRAM) write performance evaluation generally designated by the reference character 100 in accordance with the preferred embodiment. SRAM cell write performance evaluation circuit 100 includes a SRAM core 102, such as a 16×16 cell array where each wordline is connected to only one bit-column, a ring oscillator circuit 104, an input logic 106, an output logic 108 and a state machine 110.

While SRAM core 102 is illustrated as a 16×16 cell array, it should be understood that this is only an example. Various array sizes can be used to implement the SRAM core 102 in accordance with the present invention.

The ring oscillator circuit 104 is used to generate wordline pulses WL for each of the multiple, for example sixteen wordline inputs WL(0)-WL(15) and a precharge signal PCH applied to the SRAM core 102. The state machine 110 is used to control the operation of the ring oscillator circuit 104, input logic 106, output logic 108 for write and read operations for implementing SRAM cell write performance evaluation.

SRAM cell write performance evaluation circuit 100 has one input labeled ENABLE applied to the state machine 110, and one output labeled OUT of output logic 108 that oscillates. The frequency of oscillation for the output signal OUT when ENABLE is low, and the frequency of oscillation for OUT when ENABLE is high, are used to show the required wordline pulse width to write the SRAM cells. The input logic 106 provides data inputs applied to a local evaluation circuit 112 of the SRAM core 102 and local evaluation circuit 112 also receives the precharge signal PCH from ring oscillator 104. The DOT output of the local evaluation circuit 112 provides respective inputs to the output logic 108. A read path of the output logic 108 is illustrated and described with respect to FIGS. 4 and 5.

SRAM cell write performance evaluation circuit 100 is very simple to use and no special test patterns are required. The required operations for implementing SRAM cell write performance evaluation are to first simply measure the output frequency OUT with ENABLE low. Then, raise ENABLE, wait a few clock cycles, and measure the output frequency OUT again. From these two frequencies the required wordline pulse width to write the cell is identified.

Figure 2:
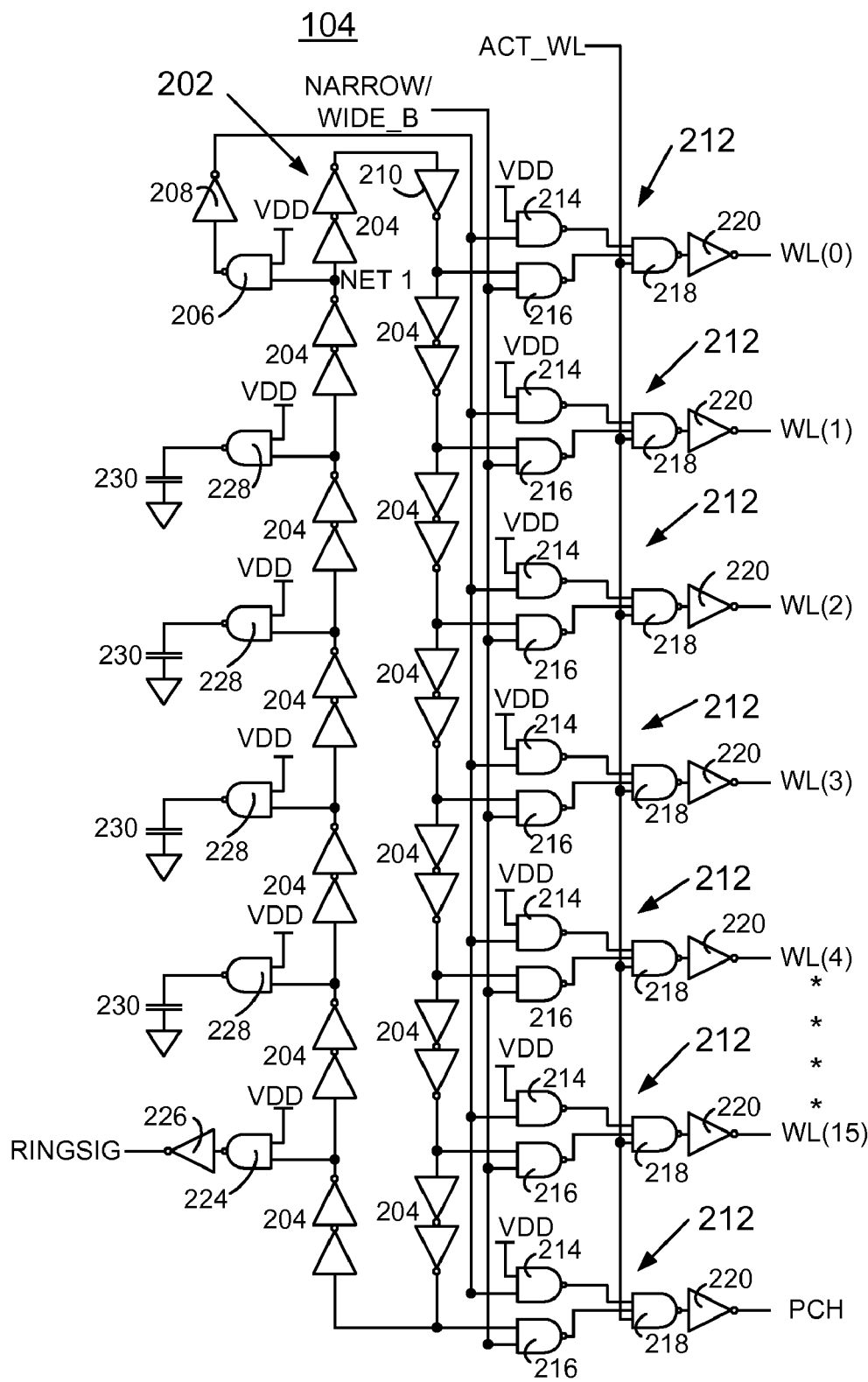
FIG. 2 is a schematic diagram illustrating an exemplary ring oscillator circuit of the SRAM cell write performance evaluation circuit of FIGS. 1A and 1B in accordance with the preferred embodiment.

Referring now to FIG. 2, there is shown an exemplary ring oscillator circuit 104 of the SRAM cell write performance evaluation circuit 100 in accordance with the preferred embodiment. Ring oscillator circuit 104 receives inputs ACT_WL and NARROW/WIDE_B from the state machine 110. The signal ACT_WL controls when wordlines and the precharge signals are generated. The signal NARROW/WIDE_B controls whether the wordlines and precharge signals are wide, to ensure that the data is correctly written and read, or narrow to test the write performance of the SRAM cells. Ring oscillator circuit 104 provides the output RINGSIG applied to the output logic 108, and the plurality of wordline outputs WL(0)-WL(15) and precharge signal PCH applied to the SRAM core 102.

Ring oscillator circuit 104 includes a chain or ring generally designated by reference character 202 including a plurality of stages or inverter pairs 204 connected in series. At a node NET 1 of the oscillator chain 202, a two input NAND gate 206 includes an input connected to node NET 1 and an input connected to a positive supply rail VDD. The output of the two input NAND gate 206 is inverted by an inverter 208 and applied to each of a plurality of wordline pulse generator circuits generally designated by reference character 212 and providing wordline outputs WL(0)-WL(15). The ring signal at node NET 1 is coupled by a first inverter pair 204 in the ring 202 and is inverted by an inverter 210 and applied to the wordline pulse generator circuit 212 providing wordline output WL(0).

Each of the wordline pulse generator circuits 212 include a pair of two input NAND gates 214, 216, a three input NAND gate 218 and an inverter 220. The input NARROW/WIDE_B is applied to an input of the NAND gate 216 of each of the wordline pulse generator circuits 212. The output of inverter 208 is applied to an input of the NAND gate 214 of each of the wordline pulse generator circuits 212. The NAND gate 216 has an input connected between respective series connected inverter pairs 204 in the chain 202. Each of the two input NAND gates 214, 216 has a respective output applied to the three input NAND gate 218, which has a third input receiving the signal ACT_WL for controlling when wordlines and the precharge signals are generated. Inverter 220 inverts the output of the three input NAND gate 218. The respective output of inverter 220 of each of the pulse generator circuits 212 respectively provides the plurality of wordline outputs WL(0)-WL(15) and precharge signal PCH.

A ring output path includes a two input NAND gate 224 having an input connected between two inverter pairs 204 and an input connected to VDD. The NAND gate output is inverted by an inverter 226, which provides output RINGSIG. A plurality of two input NAND gates 228 having an output coupled by a capacitor 230 to ground potential, has an input connected between respective series connected inverter pairs 204 in the chain 202 from ring connection for output RINGSIG to the node NET 1. These NAND gates 228 insure that all inverter pairs 204 in the ring oscillator 104 have the same capacitance loading. Timing considerations for the ring oscillator circuit 104 require that the delay through the state machine of RINGSIG rising to the correct signals switching, especially ACT_WL is less than the delay from output RINGSIG to node NET 1 in FIG. 2. Extra delay can be added to the ring path if required.

In narrow mode of ring oscillator input NARROW/WIDE_B, wordline output pulses at output WL<0> are very narrow and the wordline output pulses are progressively wider until WL<15> and the precharge signal PCH is the widest signal pulse. In initial wide mode, the signal NARROW/WIDE_B causes all the wordlines and precharge signals to be wide. When ENABLE is low, the signal RINGSIG is sent to the output of the SRAM cell write performance evaluation circuit 100. From this, delay per stage of the oscillator can be found, and the actual wordline pulse widths can also be found.

Referring also to FIG. 3, there are shown timing diagrams illustrating the operation of the SRAM cell write performance evaluation circuit 100. In FIG. 3, waveforms illustrate the input signal ENABLE, oscillator output signal RINGSIG, oscillator control signal ACT_WL, input DATA, read/write control R/W_B, the ring oscillator input NARROW/WIDE_B, and a wordline output pulses at an exemplary output WL.

SRAM cell write performance evaluation circuit 100 operates as follows. During a first time period indicated by an arrow labeled A of a first write operation, the input signal ENABLE is low. While ENABLE is low the SRAM cell write performance evaluation circuit 100 repeatedly writes 0s as illustrated at DATA with wide wordline pulses, as illustrated at output WL.

Then when ENABLE goes high one more set of 0s are written with wide wordline pulses during a next time period indicated by an arrow labeled B. With the wordlines disabled indicated by ACT_WL during a next time period indicated by an arrow labeled C, the control signals indicated by ring oscillator input NARROW/WIDE_B are switched to prepare to write 1s with narrow wordline pulses.

During a next time period indicated by an arrow labeled D, 1s are written with a very narrow wordline pulse width for WL<0> and with an incrementally wider wordline pulse width until WL<15>. With the wordlines disabled, the control signals are switched to prepare to read the cells with wide wordline pulses during a next time period indicated by an arrow labeled E. Then the cells are read with wide WL pulses during a next time period indicated by an arrow labeled F.

Then during a next time period indicated by an arrow labeled G wordlines are deactivated and the control signals are switched back to their original state. The results of the read determine how many times the RINGSIG signal is divided before it is sent to the output OUT. This output signal OUT shows the required wordline pulse width to write the cell. During a next time period indicated by an arrow labeled H, when the ENABLE goes low, the control signals are switched back to the state of continually writing 0s. When ENABLE is low, the output OUT oscillates at the natural frequency RINGSIG of the oscillator 104.

Figure 4:
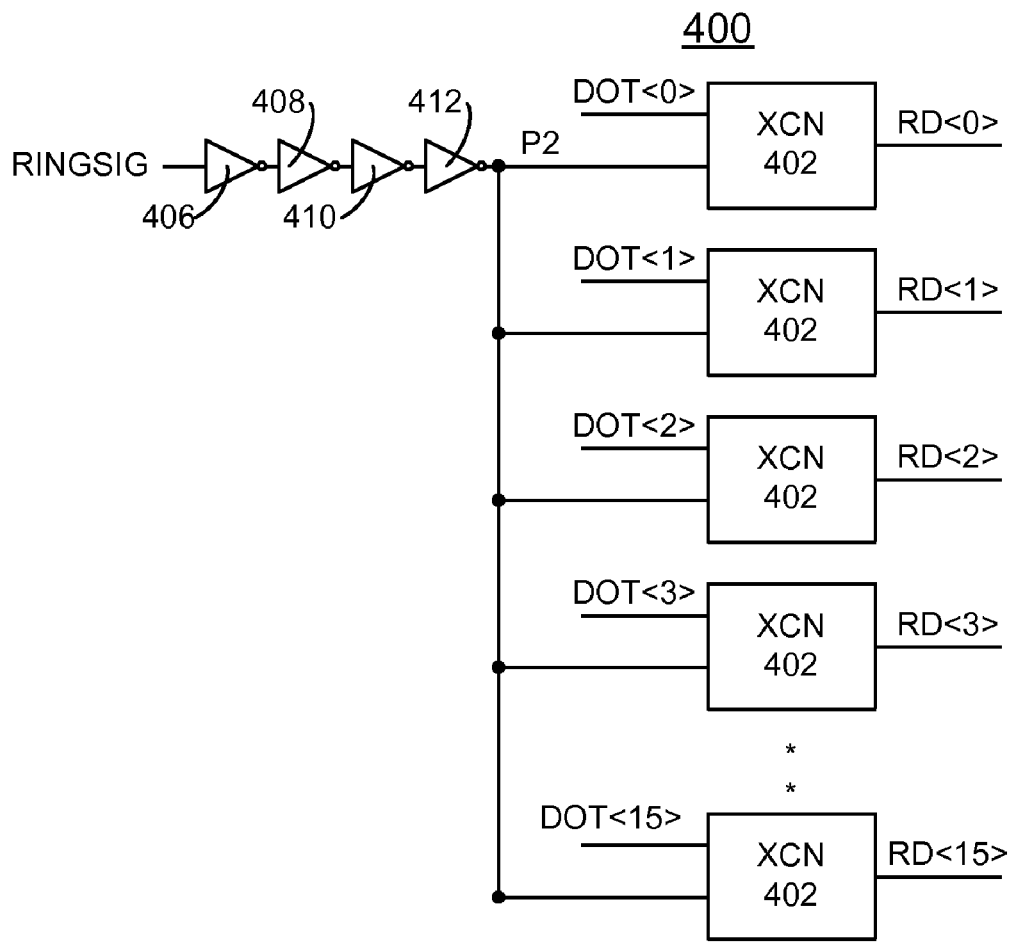
FIGS. 4, 5 and 6 are schematic diagrams illustrating exemplary output logic of the SRAM cell write performance evaluation circuit of FIGS. 1A and 1B in accordance with the preferred embodiment.
Figure 5:
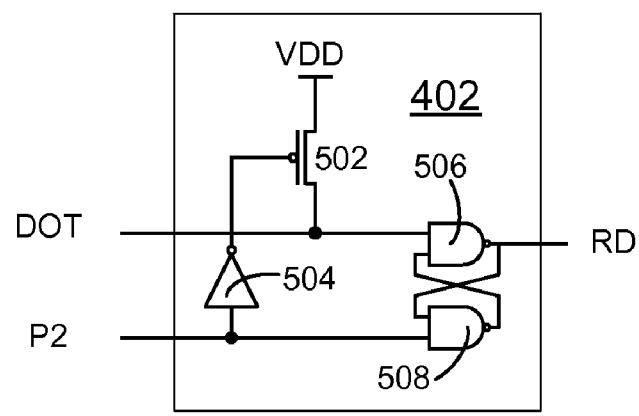

FIGS. 4 and 5 together illustrate a read path generally designated by the reference character 400 of SRAM cell write performance evaluation circuit 100 in accordance with the preferred embodiment. Read path 400 includes a respective data input DOT<0>-DOT<15> applied to a read circuit XCN 402, receiving the RINGSIG applied by a plurality of series connected inverters 406, 408 410, 412 at a node P2. The read circuit XCN 402 provides a respective output RD<0>-RD<15>.

Referring to FIG. 5, the read circuit XCN 402 is illustrated. The read circuit XCN 402 includes a precharge P-channel field effect transistor (PFET) 502 connected between the data input DOT node. PFET 502 has a gate input applied by an inverter 504 having an input connected to node P2. The read circuit XCN 402 includes a pair of cross-connected two input NAND gates 506, 508. The data input DOT node is applied to NAND gate 506 with the output of NAND gate 508 applied to the other input of NAND gate 506. The RINGSIG applied by the series connected inverters 406, 408, 410, 412 at node P2 is applied to NAND gate 508 with the output of NAND gate 506 applied to the other input of NAND gate 508.

Figure 6:
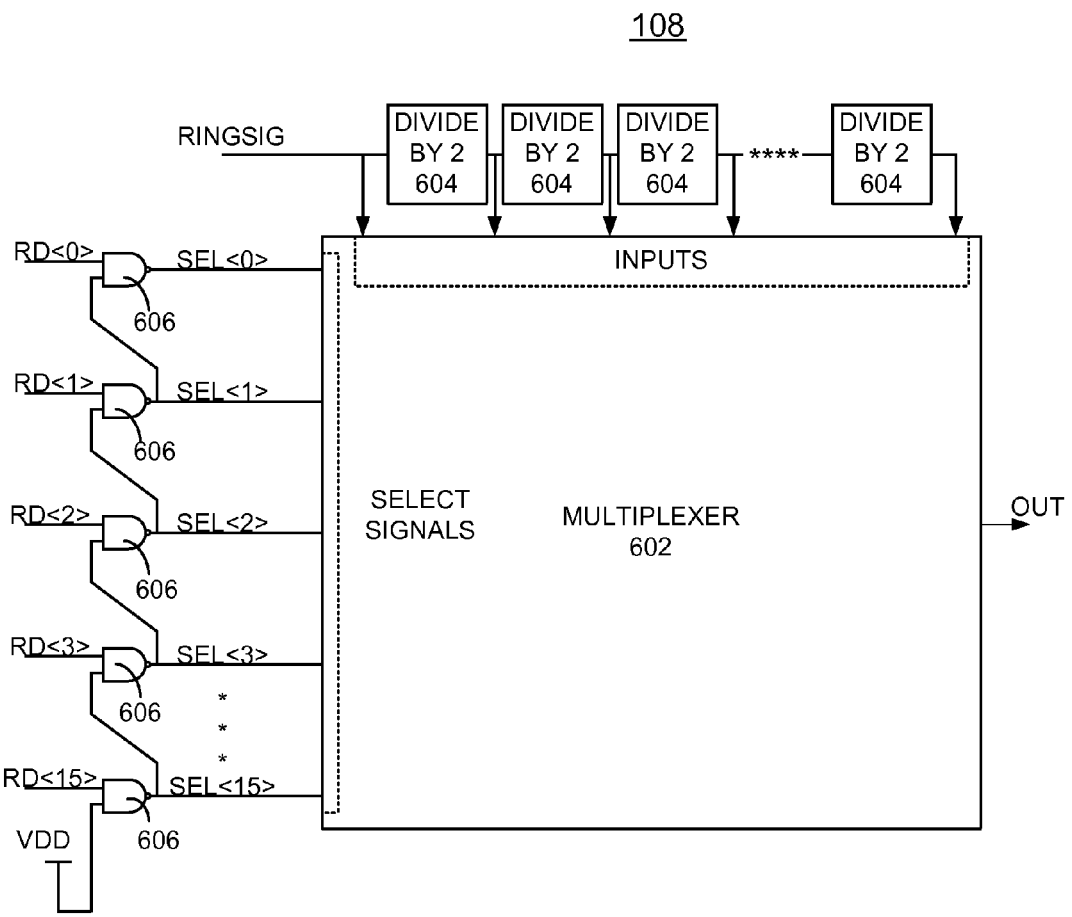

Referring to FIG. 6, there is shown exemplary output logic 108 of the SRAM cell write performance evaluation circuit 100. When ENABLE is high, the SRAM cell write performance evaluation circuit 100 determines the wordline pulse width required to write the cell by reading the cells and setting a select bit in an output multiplexer 602 of the output logic 108 based on whether the cell connected was written properly. The frequency output RINGSIG of the oscillator 104 is applied to a first one of a plurality of frequency dividers or divide by 2 circuits 604 that are connected in a chain. The output RINGSIG, and the respective frequency divided output of the plurality of frequency dividers 604 are applied to respective inputs of the output multiplexer 602. A respective NAND gate 606 provides a select signal to the output multiplexer 602 based upon the select bits from the read. The select bits from the read determine how many times the frequency is divided. Then, the output signal OUT oscillates at the natural frequency of the oscillator divided by the selected multiple of 2, which is provided by the selected one of the chained divide by 2 circuits 604. The state machine 110 is used to step through the required states of the signals that control the read and write operations.

Figure 7:
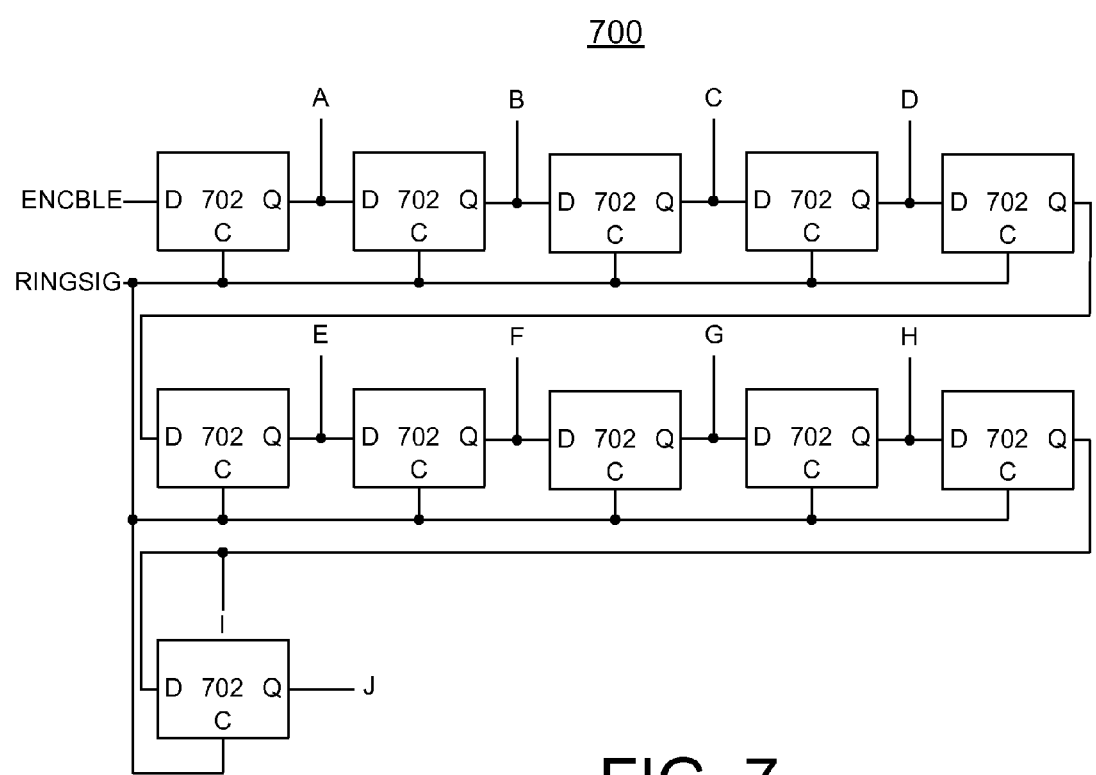
FIG. 7 is a schematic diagram illustrating exemplary enable signal capture logic of the SRAM cell write performance evaluation circuit of FIGS. 1A and 1B in accordance with the preferred embodiment.

Referring to FIG. 7, there is shown an exemplary enable signal capture logic generally designated by the reference character 700 of the state machine 110 of the SRAM cell write performance evaluation circuit 100. Enable signal capture logic 700 includes a plurality of series connected D-latches 702, each receiving a clock input C of the frequency output RINGSIG of the oscillator 104. The respective lettered outputs A-J of the D-latches 702 are used to control the state machine 110.

Figure 8:
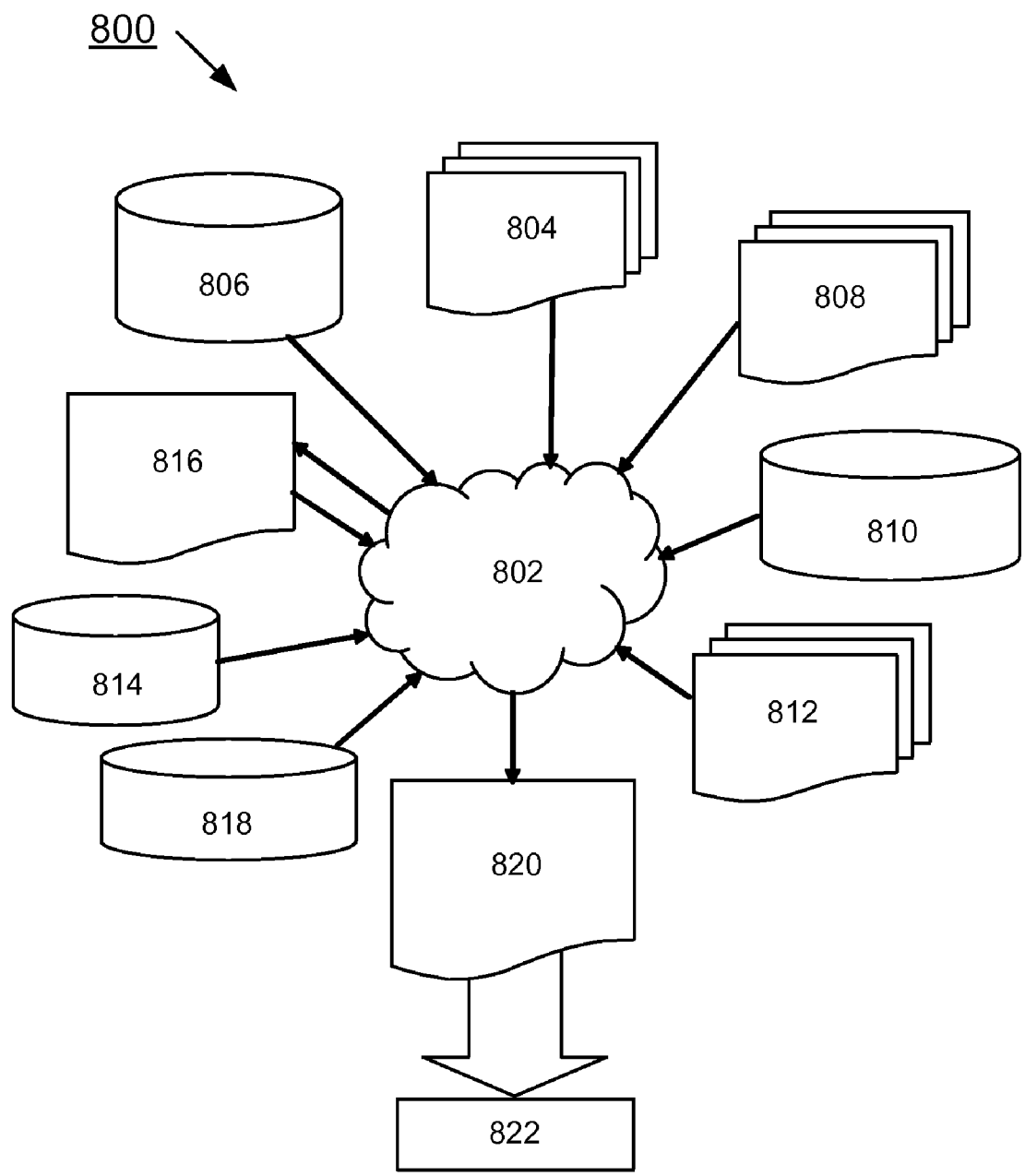
FIG. 8 is a flow diagram of a design process used in semiconductor design, manufacturing, and/or test.

FIG. 8 shows a block diagram of an example design flow 800. Design flow 800 may vary depending on the type of IC being designed. For example, a design flow 800 for building an application specific IC (ASIC) may differ from a design flow 800 for designing a standard component. Design structure 802 is preferably an input to a design process 804 and may come from an IP provider, a core developer, or other design company or may be generated by the operator of the design flow, or from other sources. Design structure 802 comprises circuits 100, 104, 108, and circuit 700 in the form of schematics or HDL, a hardware-description language, for example, Verilog, VHDL, C, and the like. Design structure 802 may be contained on one or more machine readable medium. For example, design structure 802 may be a text file or a graphical representation of 100, 104, 108, and circuit 700. Design process 804 preferably synthesizes, or translates, circuit 100, 104, 108, and circuit 700 into a netlist 806, where netlist 806 is, for example, a list of wires, transistors, logic gates, control circuits, I/O, models, etc. that describes the connections to other elements and circuits in an integrated circuit design and recorded on at least one of machine readable medium. This may be an iterative process in which netlist 806 is resynthesized one or more times depending on design specifications and parameters for the circuits.

Design process 804 may include using a variety of inputs; for example, inputs from library elements 808 which may house a set of commonly used elements, circuits, and devices, including models, layouts, and symbolic representations, for a given manufacturing technology, such as different technology nodes, 32 nm, 45 nm, 90 nm, and the like, design specifications 810, characterization data 812, verification data 814, design rules 816, and test data files 818, which may include test patterns and other testing information. Design process 804 may further include, for example, standard circuit design processes such as timing analysis, verification, design rule checking, place and route operations, and the like. One of ordinary skill in the art of integrated circuit design can appreciate the extent of possible electronic design automation tools and applications used in design process 804 without deviating from the scope and spirit of the invention. The design structure of the invention is not limited to any specific design flow.

Design process 804 preferably translates an embodiment of the invention as shown in FIGS. 1A, 1B, 2, 4, 5, 6, and 7 along with any additional integrated circuit design or data (if applicable), into a second design structure 820. Design structure 820 resides on a storage medium in a data format used for the exchange of layout data of integrated circuits, for example, information stored in a GDSII (GDS2), GL1, OASIS, or any other suitable format for storing such design structures. Design structure 820 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1A, 1B, 2, 4, 5, 6, and 7. Design structure 820 may then proceed to a stage 822 where, for example, design structure 820 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A design structure embodied in a machine readable medium used in a design process, the design structure comprising:
a static random access memory (SRAM) cell write performance evaluation circuit including a SRAM core, said SRAM core including a plurality of wordlines, each wordline being connected to connected to one SRAM cell from only one bit column;
a ring oscillator circuit coupled to said SRAM core selectively generating wordline pulses;
an input logic coupled to said SRAM core applying data to the SRAM core,
an output logic coupled to said SRAM core and ring oscillator circuit selectively providing an output oscillator signal to identify a minimum wordline pulse width to write said SRAM cell; and
a state machine coupled to said ring oscillator circuit and said input logic, said state machine controlling said ring oscillator circuit to enable incrementally varying a wordline pulse width and said state machine controlling write and read operations to said SRAM core for implementing SRAM cell write performance evaluation.

2. The design structure of claim 1, wherein the design structure comprises a netlist, which describes the circuit.

3. The design structure of claim 1, wherein the design structure resides on storage medium as a data format used for the exchange of layout data of integrated circuits.

4. The design structure of claim 1, wherein the design structure includes at least one of test data files, characterization data, verification data, or design specifications.

5. The design structure of claim 1 includes an enable control signal applied to said state machine to select a first write operation, where said SRAM cell write performance evaluation circuit simultaneously writes all SRAM cells to a known state with said ring oscillator generating wide wordline pulses to ensure all cells are written.

6. The design structure of claim 5, wherein a state of said enable control signal is changed to select a second write operation, where said SRAM cell write performance evaluation circuit simultaneously writes all SRAM cells to an opposite state.

7. The design structure of claim 6, wherein during said second write operation each said wordline has a different narrow pulse width generated by said ring oscillator with only some of said SRAM cells written properly.

8. The design structure of claim 7, wherein said ring oscillator includes a series of pulse generators creating signals with different pulse widths to provide each said wordline with said different narrow pulse width.

9. The design structure of claim 7, wherein said SRAM core includes a plurality of N wordlines, and wherein a first one WL<0> of said wordlines has a set narrow pulse width and other ones from WL<1> to WL<N> of said wordlines have progressively wider pulse widths and a precharge signal has a widest signal pulse width.

10. The design structure of claim 7, wherein responsive to said second write operation, said SRAM cell write performance evaluation circuit selects a read operation, reading all SRAM cells with said wide wordline pulses generated by said ring oscillator.

11. The design structure of claim 10, wherein responsive to said read operation, one of a plurality of frequency divider signals is selected for said output oscillator signal to identify said minimum wordline pulse width to write said SRAM cell.

12. The design structure of claim 1, wherein said output logic includes an output multiplexer and wherein read operation includes SRAM cell write performance evaluation circuit reading all said SRAM cells and setting a select bit in an output multiplexer responsive to each respective cell of said SRAM cells being written properly.

13. The design structure of claim 12, wherein said output logic includes a plurality of frequency dividers connected in a chain, a first one of said plurality of frequency dividers receiving a first frequency of said ring oscillator.

14. The design structure of claim 13, wherein said select bits from said read operation determines a number of said plurality of frequency dividers in said chain dividing said first frequency to provide said output oscillator signal to identify said minimum wordline pulse width to write said SRAM cell.

15. The design structure of claim 13, wherein each of said plurality of frequency dividers connected in said chain includes a divide-by-2 frequency divider.

16. The design structure of claim 5, wherein said state machine includes a series of latches, a first one of said series of latches receiving said enable control signal.

* * * * *

UNITED STATES PATENT AND TRADEMARK OFFICE
CERTIFICATE OF CORRECTION

| | | |
|---|---|---|
| PATENT NO. | : 7,788,554 B2 | Page 1 of 1 |
| APPLICATION NO. | : 11/873173 | |
| DATED | : August 31, 2010 | |
| INVENTOR(S) | : Adams et al. | |

It is certified that error appears in the above-identified patent and that said Letters Patent is hereby corrected as shown below:

Title Page, Related U.S. Application Data (63):

Please delete "Continuation-in-part of application No. 11/845,866, filed on Aug. 28, 2007, now Pat. No. 7,503,340" and insert -- Continuation-in-part of application No. 11/845,866, filed on Aug. 28, 2007, now Pat. No. 7,505,340 -- therefor.

Signed and Sealed this
Sixth Day of May, 2014

Michelle K. Lee
*Deputy Director of the United States Patent and Trademark Office*